US012588140B2

(12) United States Patent
Xu et al.

(10) Patent No.: US 12,588,140 B2
(45) Date of Patent: Mar. 24, 2026

(54) ELECTRONIC CONTROL UNIT INTERFACES WITH FLEXIBLE INPUT SIGNAL CONDITIONING

(71) Applicant: Cummins Inc., Columbus, IN (US)

(72) Inventors: Sheng Xu, Greenwood, IN (US); Mark D. Akins, Columbus, IN (US); Scott G. Decker, Columbus, IN (US)

(73) Assignee: Cummins Inc., Columbus, IN (US)

( * ) Notice: Subject to any disclaimer, the term of this patent is extended or adjusted under 35 U.S.C. 154(b) by 340 days.

(21) Appl. No.: 18/496,148

(22) Filed: Oct. 27, 2023

(65) Prior Publication Data

US 2025/0142721 A1 May 1, 2025

(51) Int. Cl.
H05K 1/02 (2006.01)

(52) U.S. Cl.
CPC ........... H05K 1/0292 (2013.01); H05K 1/029 (2013.01)

(58) Field of Classification Search
CPC ............................. H05K 1/029; H05K 1/0292
See application file for complete search history.

(56) References Cited

U.S. PATENT DOCUMENTS

| 5,544,000 | A | 8/1996 | Suzuki et al. | |
| 6,897,688 | B2 | 5/2005 | Lee | |
| 6,981,090 | B1 | 12/2005 | Kutz et al. | |
| 12,049,852 | B1 * | 7/2024 | Echague | F02D 41/3094 |
| 2005/0204224 | A1 | 9/2005 | Piasecki et al. | |

| 2005/0261821 | A1 | 11/2005 | Abe et al. | |
| 2007/0067090 | A1 | 3/2007 | Hashimoto et al. | |
| 2008/0074209 | A1 | 3/2008 | Ceylan et al. | |
| 2012/0137030 | A1 | 5/2012 | Gillingham | |
| 2012/0206889 | A1 | 8/2012 | Norman | |
| 2013/0301202 | A1 * | 11/2013 | Fowler | G06F 13/4221 |
| | | | | 361/679.41 |
| 2015/0378954 | A1 | 12/2015 | Field et al. | |

(Continued)

OTHER PUBLICATIONS

Kramolis, Josef , et al., "Sent/SPC Driver for the MPC55109 Microcentroller Family", Kramolis, Josef et al., "Sent/SPC Driver for the MPC5510 Microcontroller Family", Freescale Semiconductor Application Notes, Oct. 2010, 27 pgs.

(Continued)

*Primary Examiner* — Patrick O Neill
(74) *Attorney, Agent, or Firm* — Taft, Stettinius & Hollister LLP

(57) ABSTRACT

An electronic control unit includes a housing and an interface extending across the housing including a plurality of interface pins accessible at an exterior of the housing and at an interior of the housing. A circuit board is disposed in the housing. A plurality of conductive traces are operatively coupled with the circuit board and extending between a plurality of discrete component footprints. A microcontroller is positioned on the microcontroller footprint and includes an input pin conductively coupled with a first conductive trace. An input terminal positioned on the input terminal footprint and conductively coupled with a second conductive trace and one of the plurality of interface pins. A flexible input signal conditioning (FISC) circuit comprising a plurality of discrete components positioned on respective discrete component footprints and conductively coupled with respective sets of the plurality of conductive traces.

25 Claims, 6 Drawing Sheets

(56) References Cited

U.S. PATENT DOCUMENTS

| 2019/0199451 | A1 | | 6/2019 | Krall et al. |
| 2020/0145017 | A1 | | 5/2020 | Pardoen et al. |
| 2020/0412338 | A1 | * | 12/2020 | Villalon ................. F02D 41/28 |
| 2022/0107345 | A1 | | 4/2022 | Nakagawa et al. |
| 2023/0175454 | A1 | | 6/2023 | Hershorin et al. |

OTHER PUBLICATIONS

Olea, Luis , "Using the SENT Transmitter Module in S12ZVC Devices", Olea, Luis, "Using the SENT Transmitter Module in S12ZVC Devices", Freescale Semiconductor, Dec. 2013, 9 pgs.

* cited by examiner

ELECTRONIC CONTROL UNIT INTERFACES WITH FLEXIBLE INPUT SIGNAL CONDITIONING

TECHNICAL FIELD

The present application relates to electronic control unit (ECU) interfaces with flexible input signal conditioning circuitry and related apparatuses, systems, and processes.

BACKGROUND

An electronic control unit (ECU) may be provided in applications such as vehicle systems, engine systems, power generation systems, and other industrial equipment or systems. ECU designs face of number of constraints and limitations including those respecting configurability, adaptability, and flexibility to support multiple applications and features, and limitations on input/output (I/O) pins, mechanical package size, PCB density, and other constraints and limitations. There remains a significant need for the unique apparatuses, processes, and systems of the present disclosure.

DISCLOSURE OF EXAMPLE EMBODIMENTS

For the purposes of clearly, concisely, and exactly describing example embodiments of the present disclosure, the manner, and process of making and using the same, and to enable the practice, making and use of the same, reference will now be made to certain example embodiments, including those illustrated in the figures, and specific language will be used to describe the same. It shall nevertheless be understood that no limitation of the scope of the invention is thereby created, and that the invention includes and protects such alterations, modifications, and further applications of the example embodiments as would occur to one skilled in the art.

SUMMARY OF THE DISCLOSURE

Some embodiments include apparatuses including a configurable ECU interface. Some embodiments include unique processes involving a configurable ECU interface. Some embodiments include unique systems including a configurable ECU interface. Further embodiments, forms, objects, features, advantages, aspects, and benefits shall become apparent from the following description and drawings.

DETAILED DESCRIPTION OF EXAMPLE EMBODIMENTS

Figure 1:
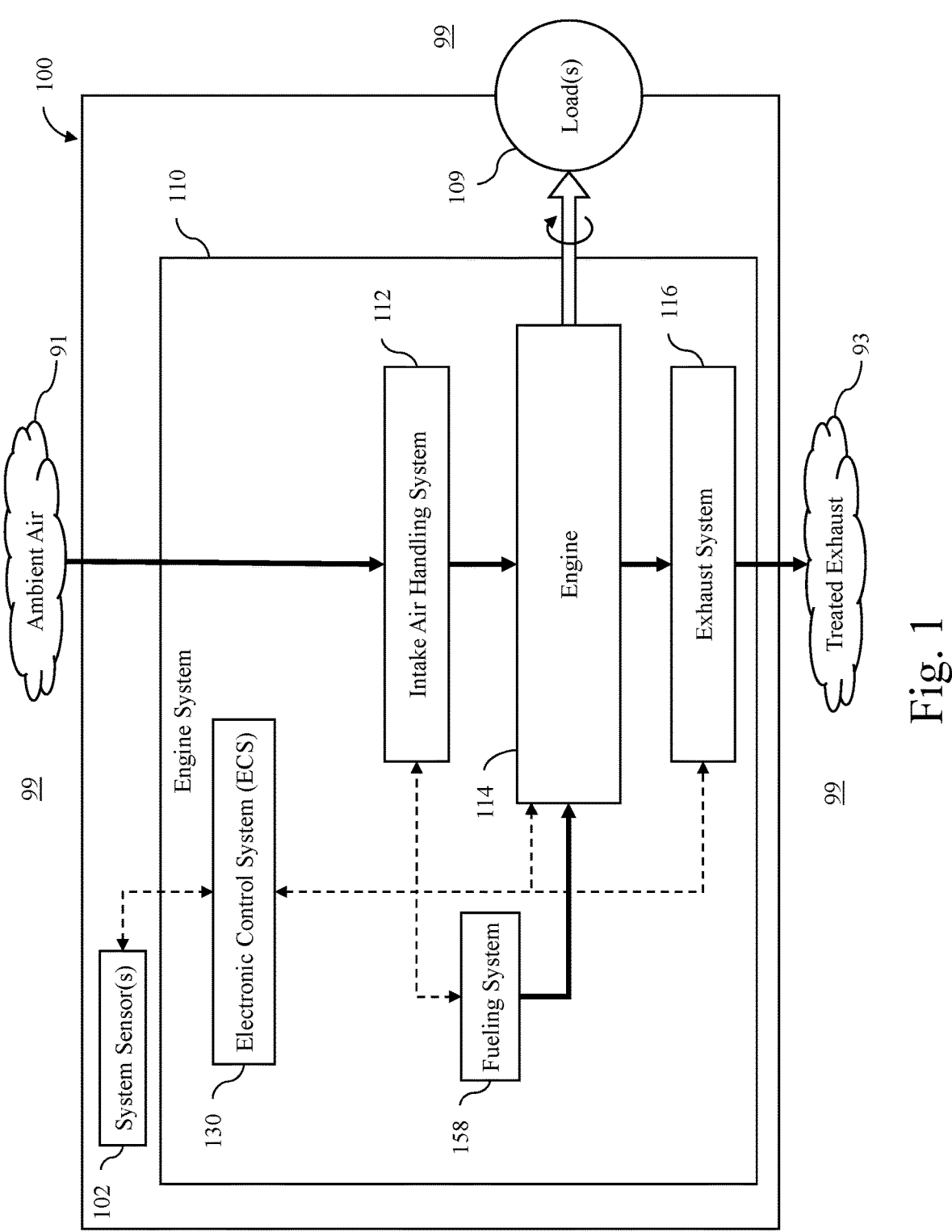
FIG. 1 is a schematic diagram depicting certain aspects of an example system in an example operating environment.

With reference to FIG. 1, there is illustrated an example system 100 including a prime mover system 110 (also referred to herein as system 110) and at least a portion of one or more loads 109. System 100 may be provide in a number of forms including, for example, in the form of a vehicle or vehicle powertrain system (e.g., an on-highway vehicle or vehicle powertrain system or an off-highway vehicle or vehicle powertrain system), a work machine or work machine powertrain system, a genset or genset powertrain system, or a hydraulic fracturing rig or hydraulic fracturing rig powertrain system, to name several non-limiting examples. In shall be appreciated that system 100 may include a number of other components as will occur to one of skill in the art with the benefit and insight of the present disclosure.

In the illustrated example, system 110 is configured and provided as an internal combustion engine system including an intake air handling system 112, an engine 114, an exhaust system 116, a fueling system 158, and an electronic control system 130. It shall be appreciated that system 110 may include a number of other components as will occur to one of skill in the art with the benefit and insight of the present disclosure. In other example embodiments, system 110 may be configured and provided as another type of prime mover system such as, for example, a hybrid combustion engine-electric prime mover system, a battery electric prime mover system, a fuel cell prime mover system, or another type of prime mover system.

Intake air handling system 112 may include one or more air handling conduits, air filters, compressors (such as a compressor of a turbocharger or supercharger), coolers (such as charger air coolers, intercoolers, and/or aftercoolers which may be, for example, of an air-to-air type or an air-to-liquid type), and sensors (such as temperature sensors, pressure sensors, mass flow sensors, and other types of sensors), as well as other components.

Engine 114 may be provided in a number of forms and typically includes a block including a plurality of cylinders and a head coupled with the block. The head typically includes intake ports, intake valves configured to selectively open and close the intake ports, exhaust ports, exhaust valves configured to selectively open and close the exhaust ports, injector bores, fuel injectors disposed in the injector bores, spark plug bores, and spark plugs disposed in the spark plug bores. A plurality of pistons may be provided in respective ones of the plurality of cylinders. A crankshaft may be coupled with the plurality of pistons and configured to translate reciprocating motion of the plurality of pistons to provide torque for driving loads 109 which may include internal loads of system 110 (such oil pumps, valvetrains, fuel pumps and other loads of engine 114, and accessory loads of system 110). It shall be appreciated that system 110 may include a number of other components as will occur to one of skill in the art with the benefit and insight of the present disclosure.

Exhaust system 116 may include one or more exhaust handling conduits, turbines (such as a turbine of a turbocharger), aftertreatment components (such as oxidation catalysts, particular filters, selective catalytic reduction (SCR) catalysts, and/or other catalysts and aftertreatment components), and sensors (such as temperature sensors, pressure sensors, oxygen or lambda sensors, mass flow sensors, and other types of sensors), as well as other components.

Fueling system 158 may be configured and provided as a high-pressure common-rail fuel injection system including a plurality of fuel injectors in fluid communication with a common fuel rail, which supplies fuel at relatively high pressure to the plurality of fuel injectors. Fuel may be supplied to the common fuel rail by a high-pressure pump which, in turn, may be fed by a relatively low-pressure fuel circuit including a booster pump, which may be immersed in a tank containing a reservoir of fuel.

ECS 130 preferably includes one or more programmable microcontrollers of a solid-state, integrated circuit type, and one or more non-transitory memory media configured to store instructions executable by the one or more microcontrollers. For purposes of the present application the term microcontroller shall be understood to also encompass microprocessors and other types of integrated circuit processors. ECS 130 is in operative communication with and may be adapted and configured to control operation of and/or receive inputs from sensors or controllers of intake air handling system 112, engine 114, exhaust system 116, and fueling system 158. ECS 130 is in operative communication with and may be adapted and configured to control operation of and/or receive inputs from one or more system sensors 102 of system 100 which may include, for example, a throttle position sensor or an accelerator position sensor. It shall be appreciated that FIG. 1 depicts control relationships between the foregoing components conceptually using dashed arrows and that various communications hardware and protocols may be utilized to implement, such as one or more controller area networks (CAN) or other communications components.

ECS 130 can be implemented in any of a number of ways that combine or distribute the control function across one or more control units in various manners. The ECS 130 may execute operating logic that defines various control, management, and/or regulation functions. This operating logic may be in the form of dedicated hardware, such as a hardwired state machine, analog calculating machine, programming instructions, and/or a different form as would occur to those skilled in the art. The ECS 130 may be provided as a single component or a collection of operatively coupled components; and may be comprised of digital circuitry, analog circuitry, or a hybrid combination of both of these types. When of a multi-component form, the ECS 130 may have one or more components remotely located relative to the others in a distributed arrangement. The ECS 130 can include multiple processing units arranged to operate independently, in a pipeline processing arrangement, in a parallel processing arrangement, or the like. It shall be further appreciated that the ECS 130 and/or any of its constituent components may include one or more signal conditioners, modulators, demodulators, Arithmetic Logic Units (ALUs), Central Processing Units (CPUs), limiters, oscillators, control clocks, amplifiers, signal conditioners, filters, format converters, communication ports, clamps, delay devices, memory devices, Analog to Digital (A/D) converters, Digital to Analog (D/A) converters, and/or different circuitry or components as would occur to those skilled in the art to perform the desired communications.

An operating environment 99 is also depicted in FIG. 1. As described above, during typical operation of system 100, ambient air 91 of operating environment 99 is received as an input to system 100, and treated exhaust 93 from system 100 is released to operating environment 99. In some embodiments, loads 109 may at least in part comprise a portion of operating environment 99. For example, in embodiments where system 100 is provided in the form of a genset or genset powertrain system, the one or more loads 109 may comprise loads at various nodes in a distributed power network in addition to load components which, even if small, are integral to system 100. As another example, in embodiments where system 100 is provided in the form of a vehicle or vehicle powertrain system, loads 109 may include forces such as wind, gravity, road surface friction and other environmental load components in addition to load components which, even if small, are integral to system 100.

Figure 2:
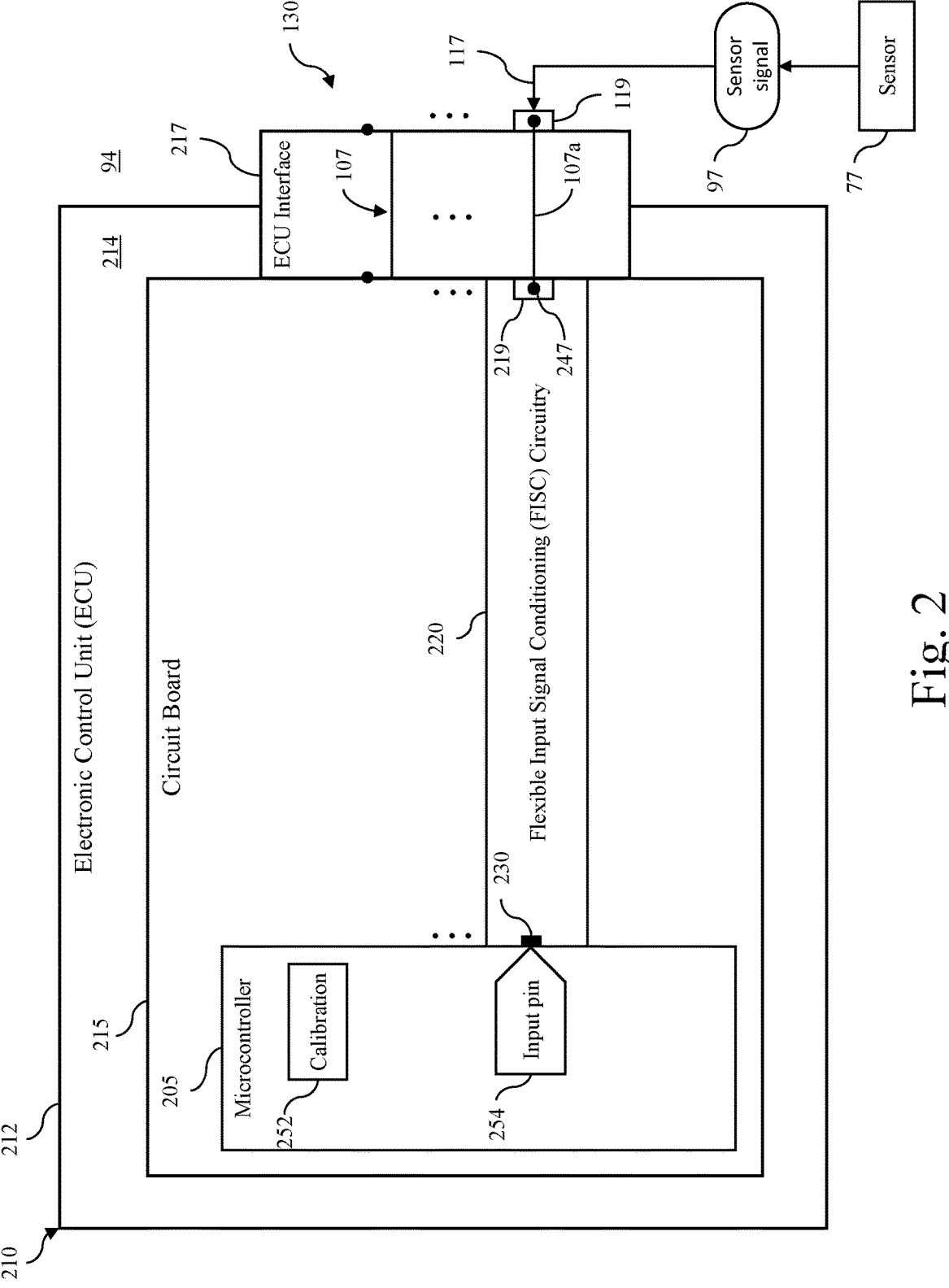
FIG. 2 is a schematic diagram depicting certain aspects of an example implementation of the system of FIG. 1

With reference to FIG. 2 there is illustrated an example implementation of ECS 130. In the illustrated example, ECS 130 comprises an electronic control unit (ECU) 210. The ECU 210 comprises a housing 212 and an interface 217. The housing 212 encloses an interior 214 containing a plurality of electronic control components. The interface 217 extends across the housing 212 and includes a plurality of interface pins 107 conductively accessible at the exterior 94 of the housing 212 and conductively accessible at the interior 214 of the housing 212.

A circuit board 215 is contained by the housing 212. The circuit board 215 comprises flexible input signal conditioning (FISC) circuitry 220 including an input terminal 219 which is operatively coupled with an interface pin 107*a* of interface 217 and operatively coupled with microcontroller 250. FISC circuitry 220 is also coupled with input pin 254 of microcontroller 250 which is mounted on and thereby operatively coupled with circuit board 215.

Figure 3:
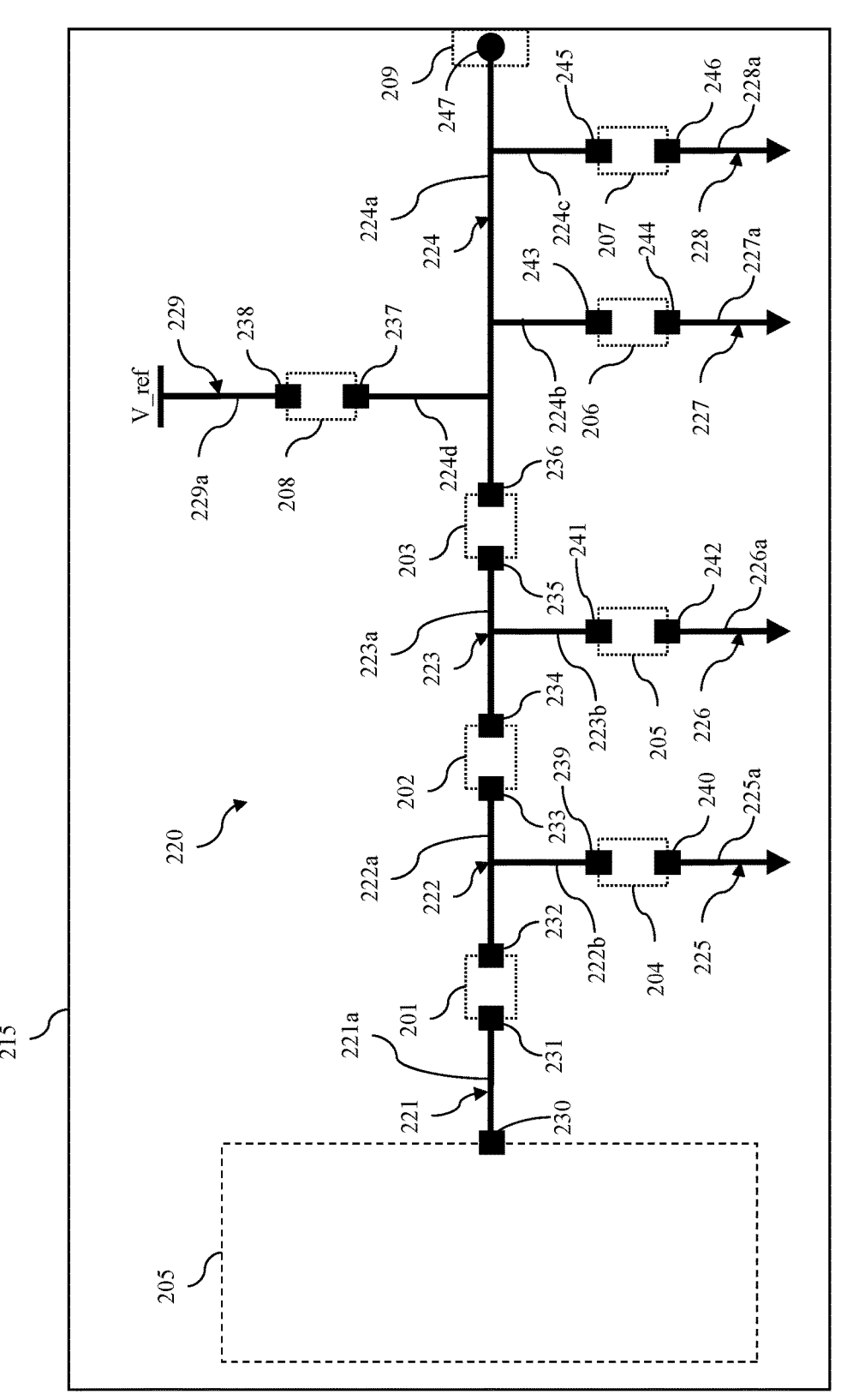
FIG. 3 is a schematic diagram depicting certain aspects of certain components of the example implementation of FIG. 2 in a first state of assembly.

Interface pin 107*a* may be selectably operatively coupled with a sensor 77 by connector 119 of a harness 117 and the same are depicted in an operatively coupled state in FIG. 1, it being appreciated that harness 117 may be also be decoupled from interface pin 107*a*. In such an operatively coupled state, interface pin 107*a* may receive a sensor signal 97 from sensor 77 which may, in turn, received and conditioned by FISC circuitry 220 and provided as input to microcontroller 205. The input signal 97 may be one of a plurality of forms depending on the selection and configuration of sensor 77. For example, sensor 77 may be configured provide sensor signal 97 in the form of an analog signal or a single edge nibble transmission (SENT) signal, With reference to FIG. 3, circuit board 215 is illustrated in a first assembly state wherein a plurality of conductors have been provided on circuit board 215. In the state of assembly illustrated in FIG. 3, the plurality of conductors comprises conductive traces 221-229 which may be integrally formed with circuit board 215 (for example, using deposition, etching, lamination, machining, masking, photoresist, and/or other formation techniques) and operatively coupled with circuit board 215 by such integral formation. In the state of assembly illustrated in FIG. 3. FISC circuitry 220 comprises conductive traces 221-229 and may consist essentially of conductive traces 221-229 in combination with one or more ground planes and/or reference planes of circuit board 215.

Conductive traces 221-229 include respective sets of mounting conductors 230-247 which are preferably formed continuously with their respective conductive traces or may be separately formed and conductively coupled with their respective conductive traces. Each of mounting conductors 230-247 may be configured and provided in in a number of forms, for example, as a mounting pad, a through-hole mount, or another type of mounting conductor. In the illustrated example, mounting conductors 230-246 are configured and provided as mounting pads and are also herein referred to as such. In other embodiments, one or more of mounting conductors 230-246 may be configured and provided as a through-hole mount, or another type of mounting conductor. In the illustrated example, mounting conductor 247 is configured and provided as a mounting pad in combination with one or more mechanical reinforcement features and is also herein referred to as a terminal mount. In other embodiments, mounting conductors 247 may be configured and provided as a through-hole mount, or another type of mounting conductor.

A portion 221a of conductive trace 221 extends between and conductively couples mounting pad 230 and mounting pad 231. Mounting pad 230 is configured to interface with footprint 205 which is configured to interface with microcontroller 250. It shall be appreciated that the configuration of circuit board mounting conductors, such as mounting pads, and footprints refers to the arrangement, geometry, positioning, sizing, and other physical characteristics facilitating interfacing with and operative coupling of the mounting pad with a circuit component that may be arranged on the footprint, operatively coupled with the mounting pad, and thereby mounted on circuit board.

Mounting pad 231 is configured to interface with footprint 201 which is configured to interface with a discrete passive circuit component. It shall be appreciated that discrete passive circuit components according to the present disclosure may comprise circuit elements such as resistors, zero-Ohm resistors or jumpers, capacitors, and diodes, for example, the particular discrete passive components described herein in connection with FIGS. 4 and 5.

Conductive trace 222 includes a first portion 222a which extends between and conductively couples mounting pad 232 and mounting pad 233. Mounting pad 232 is configured to interface with footprint 201. Mounting pad 233 is configured to interface with footprint 202 which is configured to interface with a discrete passive circuit component.

Conductive trace 222 includes a second portion 222b which extends between and conductively couples first portion 222a and mounting pad 239. Mounting pad 239 is configured to interface with footprint 204 which is configured to interface with a discrete passive circuit component.

Conductive trace 223 includes a first portion 223a which extends between and conductively couples mounting pad 234 and mounting pad 235. Mounting pad 234 is configured to interface with footprint 202. Mounting pad 235 is configured to interface with footprint 203 which is configured to interface with a discrete passive circuit component. Conductive trace 223 includes a second portion 223b which extends between and conductively couples first portion 223a and mounting pad 241. Mounting pad 241 is configured to interface with footprint 205 which is configured to interface with a discrete passive circuit component.

Conductive trace 224 includes a first portion 224a which extends between and conductively couples mounting pad 236 and terminal mount 247. Mounting pad 236 is configured to interface with footprint 203. Terminal mount 247 is configured to interface with footprint 209 which is configured to interface with terminal mount 247 which is configured to interface with circuit board input terminal 219.

Conductive trace 224 includes a second portion 224b which extends between and conductively couples first portion 223a and mounting pad 243. Mounting pad 243 is configured to interface with footprint 206 which is configured to interface with a discrete passive circuit component.

Conductive trace 224 includes a third portion 224c which extends between and conductively couples first portion 223a and mounting pad 245. Mounting pad 245 is configured to interface with footprint 207 which is configured to interface with a discrete passive circuit component.

Conductive trace 224 includes a fourth portion 224d which extends between and conductively couples first portion 223a and mounting pad 237. Mounting pad 237 is configured to interface with footprint 208 which is configured to interface with a discrete passive circuit component.

Conductive traces 225, 226, 227, 228 are configured to provide grounding of FISC circuitry 220. A portion 225a of conductive trace 225 extends between and conductively couples mounting pad 240 and ground which may be structured, for example, as a ground plane of circuit board 215 which may comprise an analog ground, a digital ground, a chassis or frame ground, and/or other types of ground. Mounting pad 240 is configured to interface with footprint 204. A portion 226a of conductive trace 226 extends between and conductively couples mounting pad 242 and ground. Mounting pad 242 is configured to interface with footprint 205. A portion 227a of conductive trace 227 extends between and conductively couples mounting pad 244 and ground. Mounting pad 244 is configured to interface with footprint 206. A portion 228a of conductive trace 228 extends between and conductively couples mounting pad 246 and ground. Mounting pad 246 is configured to interface with footprint 207.

Conductive trace 229 is configured to provide a reference to FISC circuitry 220. A portion 229a of conductive trace 229 extends between and conductively couples mounting pad 238 and voltage source V_ref. Mounting pad 238 is configured to interface with footprint 208.

Figure 4:
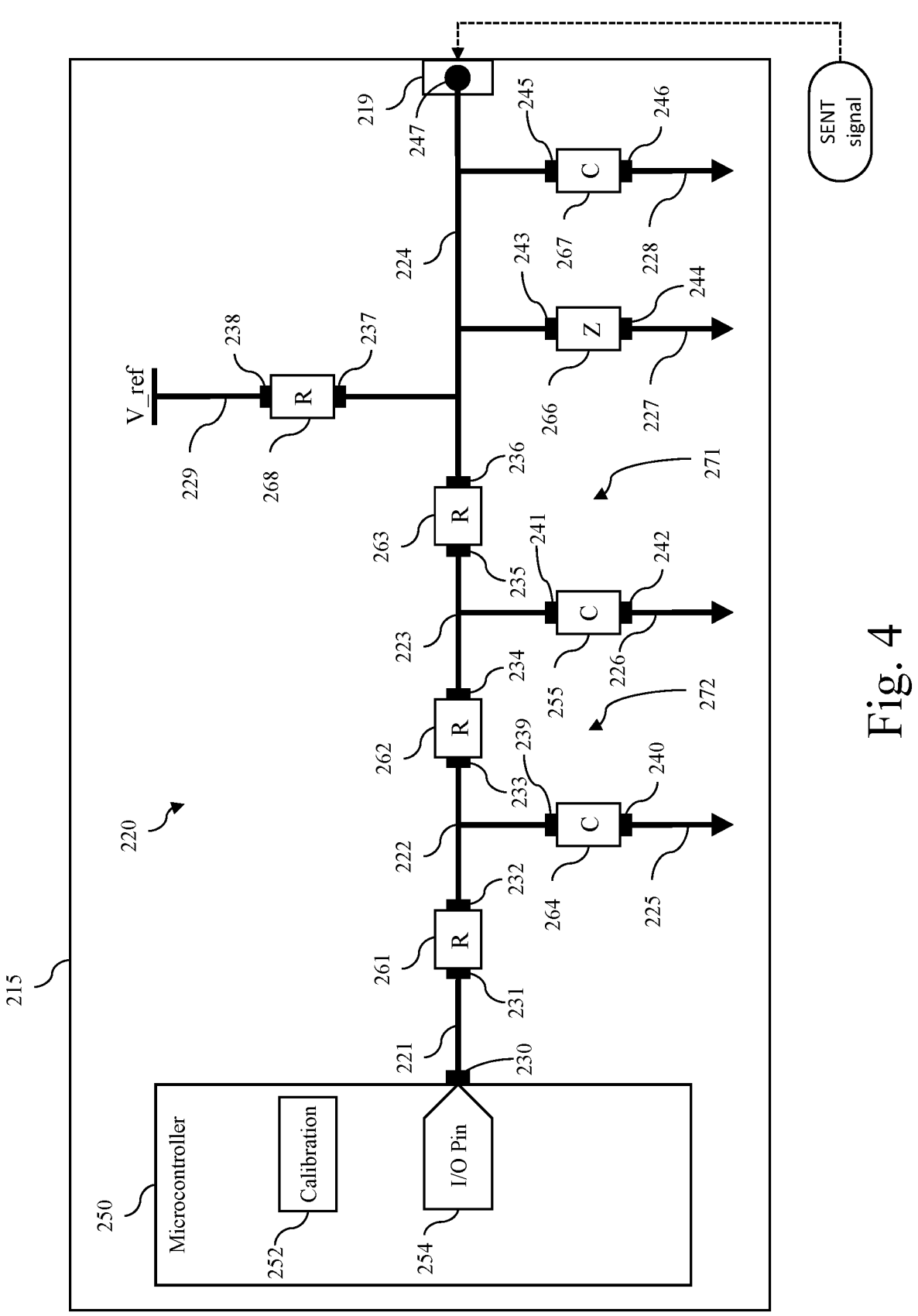
FIG. 4 is a schematic diagram depicting certain aspects of certain components of the example implementation of FIG. 2 in a second state of assembly.

In the state of assembly illustrated in FIG. 4. FISC circuitry 220 is configured and operable to receive and condition a SENT signal received, for example, from a sensor such as form of sensor 77 described in connection with FIG. 2.

With reference to FIG. 4, circuit board 215 is illustrated in a second assembly state wherein a first set of circuit components have been populated on and operatively coupled with circuit board 215. In the state of assembly illustrated in FIG. 4, the first set of circuit components comprises microcontroller 250, resistors 261, 262, 263, 268, capacitors 264, 255, 267, and clamping diode 266. In the state of assembly illustrated in FIG. 3. FISC circuitry 220 comprises conductive traces 221-229 and mounting pads 230-246 and may consist essentially of conductive traces 221-229 and mounting pads 230-246 and the first set of discrete passive components in combination with one or more ground planes and/or reference planes of circuit board 215.

Capacitor 267 is populated on footprint 207 and is conductively coupled with mounting pads 245, 246 and respectively thereby conductively coupled on one side with conductive trace 224, terminal mount 247, and input terminal 219 and conductively coupled on the other side with conductive trace 228 and ground. Capacitor 267 is configured to provide electrostatic discharge (ESD) protection for FISC circuitry 220. It shall be appreciated that the configuration of a capacitor such as capacitor 267 and the other capacitors disclosed herein refers to its capacitance value and may also refer to other electrical characteristics, such as voltage rating or current rating as well as physical characteristics such as temperature ratings and dimensions, among other characteristics.

Clamping diode 266 is populated on footprint 206 and is conductively coupled with mounting pads 243, 244 and respectively thereby conductively coupled on one side with conductive trace 224, terminal mount 247, and input terminal 219 and conductively coupled on the other side with conductive trace 227 and ground. Clamping diode 266 is configured to clamp a voltage at a node of conductive trace 224 within one or more predetermined limits or within a predetermined range. In some embodiments, clamping diode 266 may be provided in the form of a packaged component comprising two Zener diodes configured in an anti-parallel arrangement. In the illustrated embodiment, clamping diode 266 is configured and provided as a two terminal device. In other embodiment, clamping diode 266 may be configured and provided as a three terminal device with two inputs conductively coupled at a common node. In such embodiments, one or more additional mounting pads and/or one or more additional conductive traces configured to provide such conductive coupling at a common node may be provided.

Resistor 268 is populated on footprint 208 and is conductively coupled with mounting pads 237, 238 and respectively thereby conductively coupled on one side with conductive trace 224, terminal mount 247, and input terminal 219 and conductively coupled on the other side with conductive trace 229 and reference voltage V_ref. Resistor 268 is configured in a pull-up configuration to provide a default reference voltage for FISC circuitry 220. It shall be appreciated that the configuration of a resistor such as resistor 268 and the other resistors disclosed herein refers to its resistance value and may also refer to other electrical characteristics, such as voltage rating or current rating, as well as physical characteristics such as temperature ratings and dimensions, among other characteristics.

Resistor 263 is populated on footprint 203 and is conductively coupled with mounting pads 236, 235 and respectively thereby conductively coupled on one side with conductive trace 224, terminal mount 247, and input terminal 219 and conductively coupled on the other side with conductive trace 223. Capacitor 255 is populated on footprint 205 and is conductively coupled with mounting pads 241, 242 and respectively thereby conductively coupled on one side with conductive trace 223, and conductively coupled on the other side with conductive trace 226 and ground. Resistor 263 and capacitor 255 comprise a first resistive-capacitive (RC) network 271 and are respectively configured to provide first low pass filtering of an input signal received by FISC circuitry 220 via input terminal 219.

Resistor 262 is populated on footprint 202 and is conductively coupled with mounting pads 234, 233 and respectively thereby conductively coupled on one side with conductive trace 223, and conductively coupled on the other side with conductive trace 222. Capacitor 264 is populated on footprint 204 and is conductively coupled with mounting pads 239, 240 and respectively thereby conductively coupled on one side with conductive trace 222, and conductively coupled on the other side with conductive trace 225 and ground. Resistor 262 and capacitor 264 comprise a second resistive-capacitive (RC) network 272 and are respectively configured to provide second low pass filtering of an input signal received by FISC circuitry 220 via input terminal 219.

Resistor 261 is populated on footprint 201 and is conductively coupled with mounting pads 232, 231 and respectively thereby conductively coupled on one side with conductive trace 222, and conductively coupled on the other side with conductive trace 221 and mounting pad 230. Resistor 261 is configured to provide input current limiting. Microcontroller 250 is populated on footprint 205 and is conductively coupled with mounting pad 230 and the aforementioned components of FISC circuitry 220.

Figure 5:
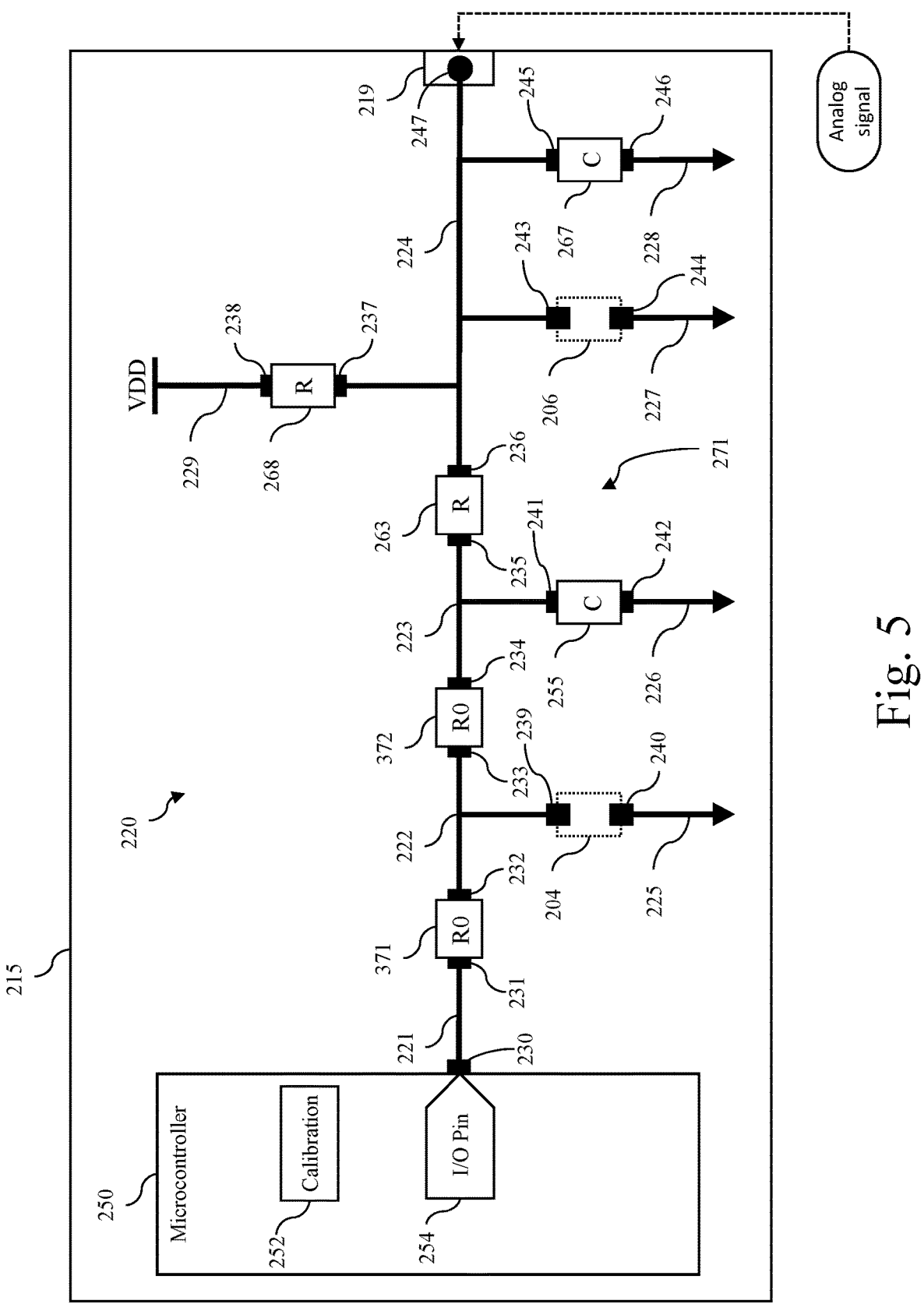
FIG. 5 is a schematic diagram depicting certain aspects of certain components of the example implementation of FIG. 2 in a third state of assembly.

With reference to FIG. 5, circuit board 215 is illustrated in a third assembly state wherein a second set of circuit components have been populated on and operatively coupled with circuit board 215. In the state of assembly illustrated in FIG. 5, the first set of circuit components comprises microcontroller 250, resistors 263, 268, zero-ohm resistors or short 371, 372, and capacitors 255, 267, and clamping diode 266. In the state of assembly illustrated in FIG. 5, FISC circuitry 220 comprises conductive traces 221-229 and mounting pads 230-246 and may consist essentially of conductive traces 221-229 and mounting pads 230-246 and the second set of discrete passive components in combination with one or more ground planes and/or reference planes of circuit board 215.

In the state of assembly illustrated in FIG. 5. FISC circuitry 220 includes capacitor 267, resistor 268, resistor 263, and capacitor 255 which may be provided in the same form and configuration and which may have the same functionality as described in connection with the state of assembly illustrated in FIG. 4. Footprints 204, 206 are unpopulated in the illustrated form. In other embodiments Footprints 204, 206 may be populated as described in connection with the state of assembly illustrated in FIG. 4 and some or all of portion 224b of conductive trace 224 and some or all of the portion 222b of conductive trace 222 may be selectably ablated or interrupted to isolate the populated components from the operative portions of FISC circuitry 220.

Zero-ohm resistor or short 372 is conductively coupled with mounting pads 234, 233 and respectively thereby conductively coupled on one side with conductive trace 223, and conductively coupled on the other side with conductive trace 222.

Zero-ohm resistor or short 371 is conductively coupled with mounting pads 232, 231 and respectively thereby conductively coupled on one side with conductive trace 222, and conductively coupled on the other side with conductive trace 221 and mounting pad 230. Microcontroller 250 is populated on footprint 205 and is conductively coupled with mounting pad 230 and the aforementioned components of FISC circuitry 220.

In the state of assembly illustrated in FIG. 5, FISC circuitry 220 is configured and operable to receive and condition an analog signal received, for example, from a sensor such as a form of sensor 77 described in connection with FIG. 2. It shall be appreciated that FISC circuitry 220 may be assembled to either the assembly state of FIG. 4 or the assembly state of FIG. 5 by the selective inclusion and exclusion of certain ones of the plurality of discrete components.

Figure 6:
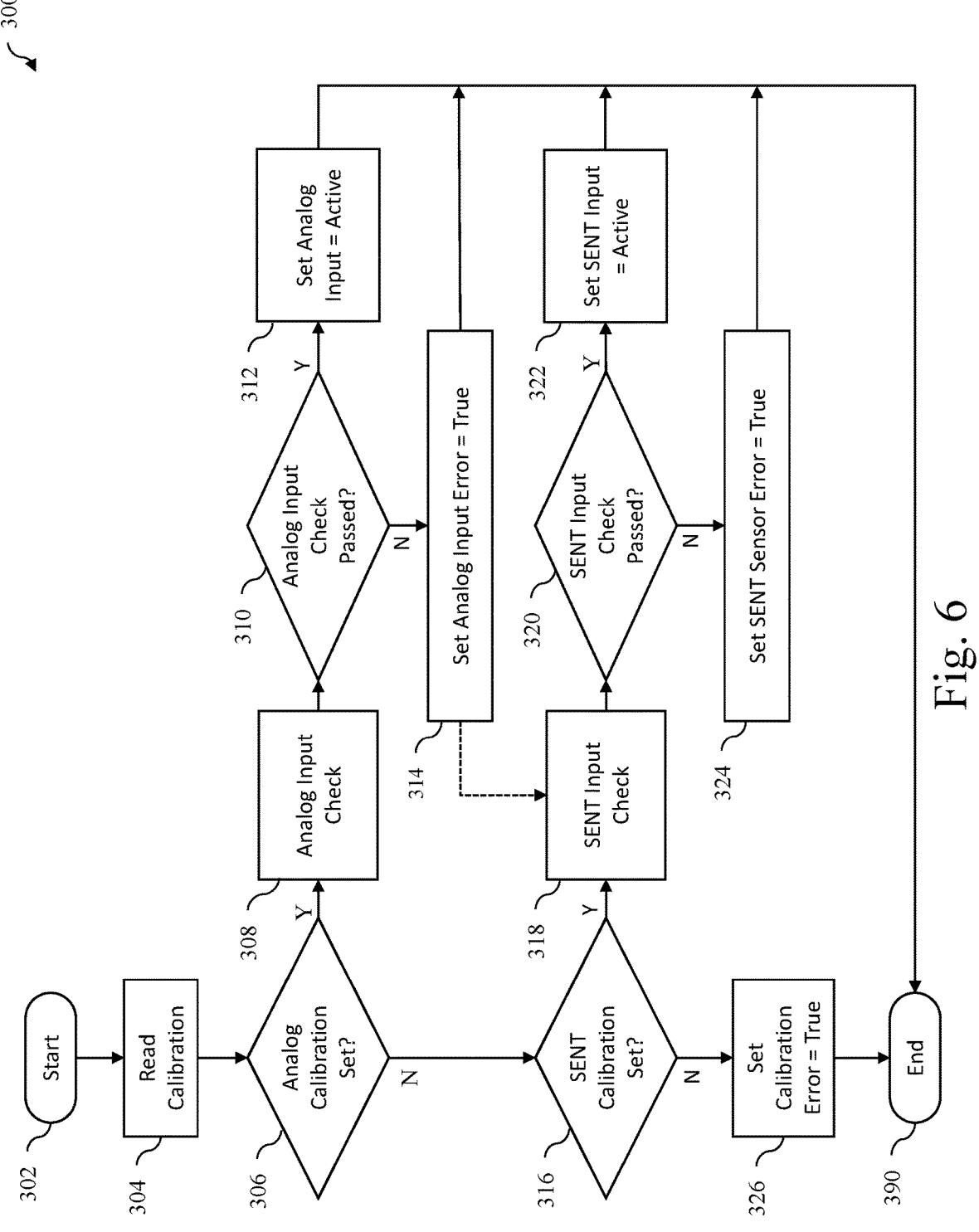
FIG. 6 is a flow diagram depicting certain aspects of an example process.

With reference to FIG. 6 there is illustrated an example system configuration process 300 (also referred to herein as process 300) which may be performed by or in connection with an electronic control system such as ECS 130 or another electronic control system, for example, by or in connection with microcontroller 250 or another microcontroller. Process 300 begins at start operation 302 and proceeds to operation 304 which reads one or more microcontroller calibrations, such as calibration 252 or another microcontroller calibration.

From operation 304, process 300 proceeds to conditional 306 which evaluates whether an analog calibration is set, for example, whether the calibration read at operation 304 is configured to cause the microcontroller to process and operate using an analog input. If conditional 306 evaluates affirmative, process 300 proceeds to operation 308.

At operation 308, the microcontroller performs an analog input check. Operation 308 may, for example, include the microcontroller otherwise controlling a system such as system 100 such that, in the case of a correctly functioning system, analog input is received, and the microcontroller is operated to detect and process such an input. From operation 308, process 300 proceeds to conditional 310.

Conditional 310 evaluates whether the analog input check was passed, for example, whether an analog input was received by the microcontroller and/or whether an expected value of an analog input was received by the microcontroller. If conditional 310 evaluates affirmative, process 300 proceeds to operation 312 which sets an analog input condition to active. From operation 312, process 300 proceeds to end operation 390 and may be subsequently repeated or recalled.

If conditional 310 evaluates negative, process 300 proceeds to operation 314 which sets an analog input error to true. From operation 312, process 300 proceeds to end operation 390 and may be subsequently repeated or recalled. In some embodiment, process 300 may alternatively optionally proceed from operation 314 to operation 318.

If conditional 306 evaluates negative, process 300 proceeds to conditional 316 which evaluates whether a SENT calibration is set, for example, whether the calibration read at operation 304 is configured to cause the microcontroller to process and operate using a SENT input. If conditional 316 evaluates negative, process 300 proceeds to operation 326 which sets a calibration error condition equal to true. From operation 326 process 300 proceeds to end operation 390 and may be subsequently repeated or recalled.

If conditional 316 evaluates affirmative, process 300 proceeds to operation 318. At operation 318, the microcontroller performs a SENT input check. Operation 318 may, for example, include the microcontroller otherwise controlling a system such as system 100 such that, in the case of a correctly functioning system, SENT input is received, and the microcontroller is operated to detect and process such an input. From operation 318, process 300 proceeds to conditional 320.

Conditional 320 evaluates whether the SENT input check was passed, for example, whether a SENT input was received by the microcontroller and/or whether an expected value of a SENT input was received by the microcontroller. If conditional 320 evaluates affirmative, process 300 proceeds to operation 322 which sets a SENT input condition to active. From operation 322, process 300 proceeds to end operation 390 and may be subsequently repeated or recalled.

If conditional 320 evaluates negative, process 300 proceeds to operation 324 which sets a SENT input error to true. From operation 322, process 300 proceeds to end operation 390 and may be subsequently repeated or recalled.

If conditional 306 evaluates negative, process 300 proceeds to conditional 316 which evaluates whether a SENT calibration is set, for example, whether the calibration read at operation 304 is configured to cause the microcontroller to process and operate using a SENT input received. If conditional 316 evaluates negative, process 300 proceeds to operation 326 which sets a calibration error condition equal to true. From operation 326 process 300 proceeds to end operation 390 and may be subsequently repeated or recalled.

As illustrated by this detailed description, the present disclosure contemplates a plurality of embodiments including the following examples. A first example embodiment is an electronic control system comprising: an electronic control unit comprising a housing and an interface extending across the housing including a plurality of interface pins accessible at an exterior of the housing and at an interior of the housing; a circuit board disposed in the housing; a plurality of conductive traces operatively coupled with the circuit board and extending between a plurality of discrete component footprints; a microcontroller positioned on a microcontroller footprint and including an input pin conductively coupled with a first conductive trace of the plurality of conductive traces; an input terminal positioned on an input terminal footprint and conductively coupled with a second conductive trace of the plurality of conductive traces and one of the plurality of interface pins; and a flexible input signal conditioning (FISC) circuit comprising a plurality of discrete components positioned on respective ones of the plurality of discrete component footprints and conductively coupled with respective sets of the plurality of conductive traces, the FISC circuit being selectably configurable into a first configuration including a capacitor configured to protect against electrostatic discharge, a voltage clamp, a reference voltage generator, a first low pass filter, and a second low pass filter, and a second configuration comprising the capacitor and the first low pass filter, and excluding the voltage clamp and the second low pass filter, the first configuration being configured to condition a SENT input signal, the second configuration being configured to condition an analog input signal.

A second example embodiment includes the features of the first example embodiment, wherein the plurality of conductive traces and the plurality of discrete component footprints comprises: the first conductive trace extending between the microcontroller footprint and a first discrete component footprint, a third conductive trace extending between the first discrete component footprint, a second discrete component footprint, and a third discrete component footprint, a fourth conductive trace extending between the second discrete component footprint, a fourth discrete component footprint, and a fifth discrete component footprint, and the second conductive trace extending between the fourth discrete component footprint, a sixth discrete component footprint, a seventh discrete component footprint, an eighth discrete component footprint, and an input terminal footprint.

A third example embodiment includes the features of the second example embodiment, wherein the capacitor is positioned on the seventh discrete component footprint and is conductively coupled with the fourth conductive trace and with ground.

A fourth example embodiment includes the features of the second example embodiment, wherein the voltage clamp comprises a resistor positioned on the sixth discrete component footprint and conductively coupled with the fourth conductive trace and with ground.

A fifth example embodiment includes the features of the second example embodiment, wherein the reference voltage generator comprises a resistor positioned on the eighth discrete component footprint and conductively coupled with a voltage source.

A sixth example embodiment includes the features of the second example embodiment, wherein the first low pass filter comprises a resistor positioned on the fourth discrete component footprint and conductively coupled with the second conductive trace and the fourth conductive trace, and a capacitor positioned on the fifth discrete component footprint and conductively coupled with the fourth conductive trace and ground.

A seventh example embodiment includes the features of the second example embodiment, wherein the second low pass filter comprises a resistor positioned on the second discrete component footprint and conductively coupled with the third conductive trace and the fourth conductive trace, and a capacitor positioned on the third discrete component footprint and conductively coupled with the third conductive trace and ground.

An eighth example embodiment includes the features of the first example embodiment, wherein the microcontroller is selectably configured to process one of an analog input signal and a SENT input signal provided to said one of the plurality of interface pins and received at the input pin of the microcontroller.

A ninth example embodiment is a process of configuring an electronic control unit including a housing and an interface extending across the housing including a plurality of interface pins accessible at an exterior of the housing and at an interior of the housing, the process comprising: populating a circuit board including a plurality of conductive traces operatively coupled with the circuit board and extending between a plurality of discrete component footprints with a microcontroller positioned on a microcontroller footprint and including an input pin conductively coupled with a first conductive trace of the plurality of conductive traces and an input terminal positioned on an input terminal footprint and conductively coupled with a second conductive trace of the plurality of conductive traces and one of the plurality of interface pins; selectably populating the circuit board with a flexible input signal conditioning (FISC) circuit comprising a plurality of discrete components positioned on respective ones of the plurality of discrete component footprints and conductively coupled with respective sets of the plurality of conductive traces according to one of: a first configuration including a capacitor configured to protect against electrostatic discharge, a voltage clamp, a reference voltage generator, a first low pass filter, and a second low pass filter, and a second configuration comprising the capacitor and the first low pass filter, and excluding the voltage clamp and the second low pass filter, the first configuration being configured to condition a SENT input signal, the second configuration being configured to condition an analog input signal; and disposing the circuit board in the housing of the electronic control unit.

A tenth example embodiment includes the features of the ninth example embodiment, wherein the plurality of conductive traces and the plurality of discrete component footprints comprises: the first conductive trace extending between the microcontroller footprint and a first discrete component footprint, a third conductive trace extending between the first discrete component footprint, a second discrete component footprint, and a third discrete component footprint, a fourth conductive trace extending between the second discrete component footprint, a fourth discrete component footprint, and a fifth discrete component footprint, and the second conductive trace extending between the fourth discrete component footprint, a sixth discrete component footprint, a seventh discrete component footprint, an eighth discrete component footprint, and an input terminal footprint.

An eleventh example embodiment includes the features of the tenth example embodiment, wherein the capacitor is positioned on the seventh discrete component footprint and is conductively coupled with the fourth conductive trace and with ground.

A twelfth example embodiment includes the features of the tenth example embodiment, wherein the voltage clamp comprises a resistor positioned on the sixth discrete component footprint and conductively coupled with the fourth conductive trace and with ground.

A thirteenth example embodiment includes the features of the tenth example embodiment, wherein the reference voltage generator comprises a resistor positioned on the eighth discrete component footprint and conductively coupled with a voltage source.

A fourteenth example embodiment includes the features of the tenth example embodiment, wherein the first low pass filter comprises a resistor positioned on the fourth discrete component footprint and conductively coupled with the second conductive trace and the fourth conductive trace, and a capacitor positioned on the fifth discrete component footprint and conductively coupled with the fourth conductive trace and ground.

A fifteenth example embodiment includes the features of the tenth example embodiment, wherein the second low pass filter comprises a resistor positioned on the second discrete component footprint and conductively coupled with the third conductive trace and the fourth conductive trace, and a capacitor positioned on the third discrete component footprint and conductively coupled with the third conductive trace and ground.

A sixteenth example embodiment includes the features of the ninth example embodiment, comprising selectably configuring the microcontroller is to process one of an analog input signal and a SENT input signal provided to said one of the plurality of interface pins and received at the input pin of the microcontroller.

A seventeenth example embodiment is an apparatus comprising: a circuit board adapted to be installed in a housing of an electronic control unit comprising an interface extending across the housing including a plurality of interface pins accessible at an exterior of the housing and at an interior of the housing; a plurality of conductive traces operatively coupled with the circuit board and extending between a plurality of discrete component footprints; a microcontroller positioned on a microcontroller footprint and including an input pin conductively coupled with a first conductive trace of the plurality of conductive traces; an input terminal positioned on an input terminal footprint and conductively coupled with a second conductive trace of the plurality of conductive traces and one of the plurality of interface pins; and a flexible input signal conditioning (FISC) circuit comprising a plurality of discrete components positioned on respective ones of the plurality of discrete component footprints and conductively coupled with respective sets of the plurality of conductive traces, the FISC circuit being selectably configurable into a first configuration including a capacitor configured to protect against electrostatic discharge, a voltage clamp, a reference voltage generator, a first low pass filter, and a second low pass filter, and a second configuration comprising the capacitor and the first low pass filter, and excluding the voltage clamp and the second low pass filter, the first configuration being configured to condition a SENT input signal, the second configuration being configured to condition an analog input signal.

An eighteenth example embodiment includes the features of the seventeenth example embodiment, wherein the plurality of conductive traces and the plurality of discrete component footprints comprises: the first conductive trace extending between the microcontroller footprint and a first discrete component footprint, a third conductive trace extending between the first discrete component footprint, a second discrete component footprint, and a third discrete component footprint, a fourth conductive trace extending between the second discrete component footprint, a fourth discrete component footprint, and a fifth discrete component footprint, and the second conductive trace extending between the fourth discrete component footprint, a sixth discrete component footprint, a seventh discrete component footprint, an eighth discrete component footprint, and an input terminal footprint.

A nineteenth example embodiment includes the features of the eighteenth example embodiment, wherein the capacitor is positioned on the seventh discrete component footprint and is conductively coupled with the fourth conductive trace and with ground.

A twentieth example embodiment includes the features of the eighteenth example embodiment, wherein the voltage clamp comprises a resistor positioned on the sixth discrete component footprint and conductively coupled with the fourth conductive trace and with ground.

A twenty-first example embodiment includes the features of the eighteenth example embodiment, wherein the reference voltage generator comprises a resistor positioned on the eighth discrete component footprint and conductively coupled with a voltage source.

A twenty-second example embodiment includes the features of the eighteenth example embodiment, wherein the first low pass filter comprises a resistor positioned on the fourth discrete component footprint and conductively coupled with the second conductive trace and the fourth conductive trace, and a capacitor positioned on the fifth discrete component footprint and conductively coupled with the fourth conductive trace and ground.

A twenty-third example embodiment includes the features of the eighteenth example embodiment, wherein the second low pass filter comprises a resistor positioned on the second discrete component footprint and conductively coupled with the third conductive trace and the fourth conductive trace, and a capacitor positioned on the third discrete component footprint and conductively coupled with the third conductive trace and ground.

A twenty-fourth example embodiment includes the features of the eighteenth example embodiment, wherein the microcontroller is selectably configured to process one of an analog input signal and a SENT input signal provided to said one of the plurality of interface pins and received at the input pin of the microcontroller.

A twenty-fifth example embodiment includes the features of the seventeenth example embodiment, comprising the electronic control unit with the circuit board installed in the housing of the electronic control unit.

It shall be appreciated that terms such as "a non-transitory memory," "a non-transitory memory medium," and "a non-transitory memory device" refer to a number of types of devices and storage mediums which may be configured to store information, such as data or instructions, readable or executable by a processor or other components of a computer system and that such terms include and encompass a single or unitary device or medium storing such information, multiple devices or media across or among which respective portions of such information are stored, and multiple devices or media across or among which multiple copies of such information are stored.

It shall be appreciated that terms such as "determine," "determined," "determining" and the like when utilized in connection with a control method or process, an electronic control system or controller, electronic controls, or components or operations of the foregoing refer inclusively to a number of acts, configurations, devices, operations, and techniques including, without limitation, calculation or computation of a parameter or value, obtaining a parameter or value from a lookup table or using a lookup operation, receiving parameters or values from a datalink or network communication, receiving an electronic signal (e.g., a voltage, SENT, current, or pulse-width modulation (PWM) signal) indicative of the parameter or value, receiving output of a sensor indicative of the parameter or value, receiving other outputs or inputs indicative of the parameter or value, reading the parameter or value from a memory location on a computer-readable medium, receiving the parameter or value as a run-time parameter, and/or by receiving a parameter or value by which the interpreted parameter can be calculated, and/or by referencing a default value that is interpreted to be the parameter value.

While example embodiments of the disclosure have been illustrated and described in detail in the drawings and foregoing description, the same is to be considered as illustrative and not restrictive in character, it being understood that only certain example embodiments have been shown and described and that all changes and modifications that come within the spirit of the claimed inventions are desired to be protected. It should be understood that while the use of words such as preferable, preferably, preferred or more preferred utilized in the description above indicates that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

The invention claimed is:

1. An electronic control system comprising:
   an electronic control unit comprising a housing and an interface extending across the housing including a plurality of interface pins accessible at an exterior of the housing and at an interior of the housing;
   a circuit board disposed in the housing;
   a plurality of conductive traces operatively coupled with the circuit board and extending between a plurality of discrete component footprints;
   a microcontroller positioned on a microcontroller footprint and including an input pin conductively coupled with a first conductive trace of the plurality of conductive traces;
   an input terminal positioned on an input terminal footprint and conductively coupled with a second conductive trace of the plurality of conductive traces and one of the plurality of interface pins; and
   a flexible input signal conditioning (FISC) circuit comprising a plurality of discrete components positioned on respective ones of the plurality of discrete component footprints and conductively coupled with respective sets of the plurality of conductive traces, the FISC circuit being selectably configurable into a first configuration including a capacitor configured to protect against electrostatic discharge, a voltage clamp, a reference voltage generator, a first low pass filter, and a second low pass filter, and a second configuration comprising the capacitor and the first low pass filter, and excluding the voltage clamp and the second low pass filter, the first configuration being configured to condition a SENT input signal, the second configuration being configured to condition an analog input signal.

2. The electronic control system of claim 1, wherein the plurality of conductive traces and the plurality of discrete component footprints comprises:

the first conductive trace extending between the micro-controller footprint and a first discrete component foot-print, a third conductive trace extending between the first discrete component footprint, a second discrete component footprint, and a third discrete component footprint, a fourth conductive trace extending between the second discrete component footprint, a fourth discrete component footprint, and a fifth discrete component footprint, and the second conductive trace extending between the fourth discrete component footprint, a sixth discrete component footprint, a seventh discrete component footprint, an eighth discrete component footprint, and an input terminal footprint.

3. The electronic control system of claim 2, wherein the capacitor is positioned on the seventh discrete component footprint and is conductively coupled with the fourth conductive trace and with ground.

4. The electronic control system of claim 2, wherein the voltage clamp comprises a resistor positioned on the sixth discrete component footprint and conductively coupled with the fourth conductive trace and with ground.

5. The electronic control system of claim 2, wherein the reference voltage generator comprises a resistor positioned on the eighth discrete component footprint and conductively coupled with a voltage source.

6. The electronic control system of claim 2, wherein the first low pass filter comprises a resistor positioned on the fourth discrete component footprint and conductively coupled with the second conductive trace and the fourth conductive trace, and a capacitor positioned on the fifth discrete component footprint and conductively coupled with the fourth conductive trace and ground.

7. The electronic control system of claim 2, wherein the second low pass filter comprises a resistor positioned on the second discrete component footprint and conductively coupled with the third conductive trace and the fourth conductive trace, and a capacitor positioned on the third discrete component footprint and conductively coupled with the third conductive trace and ground.

8. The electronic control system of claim 1, wherein the microcontroller is selectably configured to process one of an analog input signal and a SENT input signal provided to said one of the plurality of interface pins and received at the input pin of the microcontroller.

9. A process of configuring an electronic control unit including a housing and an interface extending across the housing including a plurality of interface pins accessible at an exterior of the housing and at an interior of the housing, the process comprising:

populating a circuit board including a plurality of conductive traces operatively coupled with the circuit board and extending between a plurality of discrete component footprints with a microcontroller positioned on a microcontroller footprint and including an input pin conductively coupled with a first conductive trace of the plurality of conductive traces and an input terminal positioned on an input terminal footprint and conductively coupled with a second conductive trace of the plurality of conductive traces and one of the plurality of interface pins;

selectably populating the circuit board with a flexible input signal conditioning (FISC) circuit comprising a plurality of discrete components positioned on respective ones of the plurality of discrete component footprints and conductively coupled with respective sets of the plurality of conductive traces according to one of: a first configuration including a capacitor configured to protect against electrostatic discharge, a voltage clamp, a reference voltage generator, a first low pass filter, and a second low pass filter, and a second configuration comprising the capacitor and the first low pass filter, and excluding the voltage clamp and the second low pass filter, the first configuration being configured to condition a SENT input signal, the second configuration being configured to condition an analog input signal; and disposing the circuit board in the housing of the electronic control unit.

10. The process of claim 9, wherein the plurality of conductive traces and the plurality of discrete component footprints comprises:

the first conductive trace extending between the micro-controller footprint and a first discrete component foot-print, a third conductive trace extending between the first discrete component footprint, a second discrete component footprint, and a third discrete component footprint, a fourth conductive trace extending between the second discrete component footprint, a fourth discrete component footprint, and a fifth discrete component footprint, and the second conductive trace extending between the fourth discrete component footprint, a sixth discrete component footprint, a seventh discrete component footprint, an eighth discrete component footprint, and an input terminal footprint.

11. The process of claim 10, wherein the capacitor is positioned on the seventh discrete component footprint and is conductively coupled with the fourth conductive trace and with ground.

12. The process of claim 10, wherein the voltage clamp comprises a resistor positioned on the sixth discrete component footprint and conductively coupled with the fourth conductive trace and with ground.

13. The process of claim 10, wherein the reference voltage generator comprises a resistor positioned on the eighth discrete component footprint and conductively coupled with a voltage source.

14. The process of claim 10, wherein the first low pass filter comprises a resistor positioned on the fourth discrete component footprint and conductively coupled with the second conductive trace and the fourth conductive trace, and a capacitor positioned on the fifth discrete component footprint and conductively coupled with the fourth conductive trace and ground.

15. The process of claim 10, wherein the second low pass filter comprises a resistor positioned on the second discrete component footprint and conductively coupled with the third conductive trace and the fourth conductive trace, and a capacitor positioned on the third discrete component footprint and conductively coupled with the third conductive trace and ground.

16. The process of claim 9, comprising selectably configuring the microcontroller is to process one of an analog input signal and a SENT input signal provided to said one of the plurality of interface pins and received at the input pin of the microcontroller.

17. An apparatus comprising:

a circuit board adapted to be installed in a housing of an electronic control unit comprising an interface extending across the housing including a plurality of interface pins accessible at an exterior of the housing and at an interior of the housing;

a plurality of conductive traces operatively coupled with the circuit board and extending between a plurality of discrete component footprints;

a microcontroller positioned on a microcontroller footprint and including an input pin conductively coupled with a first conductive trace of the plurality of conductive traces;

an input terminal positioned on an input terminal footprint and conductively coupled with a second conductive trace of the plurality of conductive traces and one of the plurality of interface pins; and a flexible input signal conditioning (FISC) circuit comprising a plurality of discrete components positioned on respective ones of the plurality of discrete component footprints and conductively coupled with respective sets of the plurality of conductive traces, the FISC circuit being selectably configurable into a first configuration including a capacitor configured to protect against electrostatic discharge, a voltage clamp, a reference voltage generator, a first low pass filter, and a second low pass filter, and a second configuration comprising the capacitor and the first low pass filter, and excluding the voltage clamp and the second low pass filter, the first configuration being configured to condition a SENT input signal, the second configuration being configured to condition an analog input signal.

18. The apparatus of claim 17, wherein the plurality of conductive traces and the plurality of discrete component footprints comprises:

the first conductive trace extending between the microcontroller footprint and a first discrete component footprint, a third conductive trace extending between the first discrete component footprint, a second discrete component footprint, and a third discrete component footprint, a fourth conductive trace extending between the second discrete component footprint, a fourth discrete component footprint, and a fifth discrete component footprint, and the second conductive trace extending between the fourth discrete component footprint, a sixth discrete component footprint, a seventh discrete component footprint, an eighth discrete component footprint, and an input terminal footprint.

19. The apparatus of claim 18, wherein the capacitor is positioned on the seventh discrete component footprint and is conductively coupled with the fourth conductive trace and with ground.

20. The apparatus of claim 18, wherein the voltage clamp comprises a resistor positioned on the sixth discrete component footprint and conductively coupled with the fourth conductive trace and with ground.

21. The apparatus of claim 18, wherein the reference voltage generator comprises a resistor positioned on the eighth discrete component footprint and conductively coupled with a voltage source.

22. The apparatus of claim 18, wherein the first low pass filter comprises a resistor positioned on the fourth discrete component footprint and conductively coupled with the second conductive trace and the fourth conductive trace, and a capacitor positioned on the fifth discrete component footprint and conductively coupled with the fourth conductive trace and ground.

23. The apparatus of claim 18, wherein the second low pass filter comprises a resistor positioned on the second discrete component footprint and conductively coupled with the third conductive trace and the fourth conductive trace, and a capacitor positioned on the third discrete component footprint and conductively coupled with the third conductive trace and ground.

24. The apparatus of claim 17, wherein the microcontroller is selectably configured to process one of an analog input signal and a SENT input signal provided to said one of the plurality of interface pins and received at the input pin of the microcontroller.

25. The apparatus of claim 17, comprising the electronic control unit with the circuit board installed in the housing of the electronic control unit.

* * * * *